(12) United States Patent
Cao

(10) Patent No.: US 10,345,660 B1
(45) Date of Patent: Jul. 9, 2019

(54) MANUFACTURING METHOD OF ARRAY SUBSTRATE AND MANUFACTURING METHOD OF PHOTO SPACER STRUCTURE THEREOF

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Wu Cao, Guangdong (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/051,757

(22) Filed: Aug. 1, 2018

Related U.S. Application Data

(63) Continuation of application No. PCT/CN2018/087312, filed on May 17, 2018.

(30) Foreign Application Priority Data

Mar. 20, 2018  (CN) .......................... 2018 1 0230842

(51) Int. Cl.
  *G02F 1/1362* (2006.01)
  *G02F 1/1339* (2006.01)
  (Continued)

(52) U.S. Cl.
  CPC .... *G02F 1/136209* (2013.01); *G02F 1/13394* (2013.01); *G02F 1/136286* (2013.01);
  (Continued)

(58) Field of Classification Search
  None
  See application file for complete search history.

(56) References Cited

U.S. PATENT DOCUMENTS

2010/0225605 A1* 9/2010 Wang .................... G06F 3/0412
                                                  345/173
2013/0148064 A1* 6/2013 Shih ........................ B05D 5/06
                                                  349/123

(Continued)

*Primary Examiner* — Thien F Tran
(74) *Attorney, Agent, or Firm* — Leong C. Lei

(57) ABSTRACT

Disclosed is a manufacturing method of a photo spacer structure of an array substrate, including: forming first pad carriers and second pad carriers having height difference; depositing black photosensitive resin material to cover the first pad carriers and the second pad carriers; implementing exposure to the black photosensitive resin material through a mask, having light transmitting areas and light shielding areas, and light transmission adjusting parts are arranged corresponding to the second pad carriers, and implementing development to form main photo spacers on the first pad carriers, sub photo spacers on the second pad carriers and grooves or trenches in areas around the sub photo spacer with the light transmission adjusting parts; implementing a high-temperature baking and leveling treatment to the black photosensitive resin material to level and fill at least a portion of the resin material of the sub photo spacers to the grooves or the trenches.

12 Claims, 4 Drawing Sheets

(51) Int. Cl.
G03F 7/40 (2006.01)
G02F 1/1368 (2006.01)

(52) U.S. Cl.
CPC .............. G03F 7/40 (2013.01); *G02F 1/1368* (2013.01); *G02F 2001/13396* (2013.01); *G02F 2001/13398* (2013.01); *G02F 2001/136222* (2013.01)

(56) References Cited

U.S. PATENT DOCUMENTS

2016/0370627 A1* 12/2016 Tang .................... G02F 1/13394
2017/0168347 A1* 6/2017 Li ...................... G02F 1/133345

* cited by examiner

MANUFACTURING METHOD OF ARRAY SUBSTRATE AND MANUFACTURING METHOD OF PHOTO SPACER STRUCTURE THEREOF

CROSS-REFERENCE TO RELATED APPLICATION

This application is a continuing application of PCT Patent Application No. PCT/CN2018/087312 entitled "Manufacturing method of array substrate and manufacturing method of photo spacer structure thereof", filed on May 17, 2018, which claims priority to Chinese Patent Application No. 201810230842.4, filed on Mar. 20, 2018, both of which are hereby incorporated in its entireties by reference.

FIELD OF THE INVENTION

The present invention relates to a display field, and more particularly to a manufacturing method of an array substrate and a manufacturing method of a photo spacer structure thereof.

BACKGROUND OF THE INVENTION

The Black Photo Spacer (BPS) technology is to integrate two processes of a BM (Black Matrix) and a PS (Photo Spacer) in a conventional liquid crystal display (LCD) into one process, and the black light shielding photosensitive resin is used to form three functional structures of different heights, which are the main photo spacer (Main PS), the sub photo spacer (Sub PS) and the black matrix from high to low.

FIG. 1 and FIG. 2 show structural diagrams of a conventional liquid crystal display manufactured by using BPS technology. By dicing the color resist layer 13' of the gate line region (see the F' region in FIG. 1), the main photo spacer 140' and the sub photo spacer 141' are both covered with black light shielding photosensitive resin and formed. In the areas for forming main spacer 140' and the sub photo spacer 141', the main pad 130' and the sub pad 131' of different heights are respectively formed. The final top height difference between the main photo spacer 140' and the sub photo spacer 141' is obtained by the leveling and filling effect after BPS coating.

The final height difference between the main photo spacer 140' and the sub photo spacer 141' will affect the safety range of the liquid crystal margin (LC Margin) in the cell process, thereby affecting the yield rate. In many existing applications, it comes to a problem that the height difference is too small; meanwhile, in the prior art, the top surface of the sub photo spacer 141' is not sufficiently flat enough.

SUMMARY OF THE INVENTION

The technical problem to be solved by the present invention is to provide a manufacturing method of an array substrate and a manufacturing method of a photo spacer structure thereof, which can increase the height difference between the main photo spacer and the sub photo spacer and improve the flatness, thereby improving the product quality.

For solving the aforesaid technical issue, the present invention first provides a manufacturing method of a photo spacer structure of an array substrate, comprising:

processing in at least one region of a color resist layer of the array substrate to form a plurality of first pad carriers, a plurality of second pad carriers and trench regions located between the first pad carriers and the second pad carriers; wherein a surface of the first pad carrier is higher than a surface of the second pad carrier;

depositing a layer of black photosensitive resin material in the processed region to cover areas of the first pad carriers, the second pad carriers and the trench regions;

using a mask to cover the black photosensitive resin material, wherein the mask comprises light transmitting areas covers the first pad carriers, the second pad carriers and the trench regions and light shielding areas, and light transmission adjusting parts are arranged corresponding to the areas of the second pad carriers;

implementing exposure and development to the black photosensitive resin material through the mask to form main photo spacers on the first pad carriers, to form sub photo spacers on the second pad carriers and to form a black matrix on the trench regions with the black photosensitive resin material, and forming grooves or trenches in areas around the sub photo spacer with the light transmission adjusting parts;

implementing a high-temperature baking and leveling treatment to the black photosensitive resin material after development to level and fill at least a portion of the black photosensitive resin material of the sub photo spacers to the grooves or the trenches.

The manufacturing method further comprises depositing an insulating layer on the first pad carriers, the second pad carriers and the trench regions.

As the black photosensitive resin material is a negative photosensitive material, the mask is provided with the light transmitting areas covering the plurality of first pad carriers, the second pad carriers and the trench regions, and the light transmission adjusting parts are light shielding structures; or as the black photosensitive resin material is a positive photosensitive material, the mask is provided with the light shielding areas covering the plurality of first pad carriers, the second pad carriers and the trench regions, and the light transmission adjusting parts are light transmitting structures.

The light shielding structure arranged in the area of the second pad carrier is an annular light shielding bar arranged around the area of the second pad carrier, and a width of the light shielding bar is less than 8 μm, and a distance of the light shielding bar from an edge of the sub photo spacer is less than 4 μm;

the light transmitting structure arranged in the area of the second pad carrier is an annular light transmitting bar arranged around the area of the second pad carrier, and a width of the light transmitting bar is less than 8 μm, and a distance of the light transmitting bar from the edge of the sub photo spacer is less than 4 μm.

The light shielding structure further comprises: a plurality of linear dot light shielding bars arranged in the area of the second pad carrier, wherein a length direction of each linear dot light shielding bar is perpendicular to a length direction of an etched region; or the light transmitting structure further comprises: a plurality of linear dot light transmitting bars arranged in the area of the second pad carrier, wherein a length direction of each linear dot light transmitting bar is perpendicular to the length direction of the etched region.

Processed regions are arranged along gate lines of the array thin film transistor layer.

Correspondingly, the present invention further provides a manufacturing method of an array substrate, comprising:

providing a substrate, and forming an array thin film transistor layer on the substrate, and forming at least a color resist layer on the array thin film transistor layer;

processing in at least one region of the color resist layer to form a plurality of first pad carriers, a plurality of second pad carriers and trench regions located between the first pad carriers and the second pad carriers; wherein a surface of the first pad carrier is higher than a surface of the second pad carrier;

depositing a layer of black photosensitive resin material in the processed region to cover areas of the first pad carriers, the second pad carriers and the trench regions;

using a mask to cover the black photosensitive resin material, wherein the mask comprises light transmitting areas covers the first pad carriers, the second pad carriers and the trench regions and light shielding areas, and light transmission adjusting parts are arranged corresponding to the areas of the second pad carriers;

implementing exposure and development to the black photosensitive resin material through the mask to form main photo spacers on the first pad carriers, to form sub photo spacers on the second pad carriers and to form a black matrix on the trench regions with the black photosensitive resin material, and forming grooves or trenches in areas around the sub photo spacer with the light transmission adjusting parts;

implementing a high-temperature baking and leveling treatment to the black photosensitive resin material after development to level and fill at least a portion of the black photosensitive resin material of the sub photo spacers to the grooves or the trenches.

The manufacturing method further comprises depositing an insulating layer on the first pad carriers, the second pad carriers and the trench regions, which are formed by etching.

As the black photosensitive resin material is a negative photosensitive material, the mask is provided with the light transmitting areas covering the plurality of first pad carriers, the second pad carriers and the trench regions, and the light transmission adjusting parts are light shielding structures; or as the black photosensitive resin material is a positive photosensitive material, the mask is provided with the light shielding areas covering the plurality of first pad carriers, the second pad carriers and the trench regions, and the light transmission adjusting parts are light transmitting structures.

The light shielding structure arranged in the area of the second pad carrier is an annular light shielding bar arranged around the area of the second pad carrier, and a width of the light shielding bar is less than 8 μm, and a distance of the light shielding bar from an edge of the sub photo spacer is less than 4 μm;

the light transmitting structure arranged in the area of the second pad carrier is an annular light transmitting bar arranged around the area of the second pad carrier, and a width of the light transmitting bar is less than 8 μm, and a distance of the light transmitting bar from the edge of the sub photo spacer is less than 4 μm.

The light shielding structure further comprises: a plurality of linear dot light shielding bars arranged in the area of the second pad carrier, wherein a length direction of each linear dot light shielding bar is perpendicular to a length direction of an etched region; or the light transmitting structure further comprises: a plurality of linear dot light transmitting bars arranged in the area of the second pad carrier, wherein a length direction of each linear dot light transmitting bar is perpendicular to the length direction of the etched region.

Processed regions are arranged along gate lines of the array thin film transistor layer. With implementing the embodiments of the present invention, the benefits are:

According to the manufacturing method provided by the present invention, an annular light transmission adjusting parts is arranged in the region of the mask corresponding to the second pad carrier, thus grooves or trenches can be formed around the sub photo spacer, and then the black photosensitive resin material after development is implemented with the high-temperature baking and leveling treatment, so that at least a portion of the black photosensitive resin material of the sub photo spacer is leveled and filled to the grooves or trenches to reduce the height of the sub photo spacer, thus increasing the height difference between the main photo spacer and the sub photo spacer;

meanwhile, since a plurality of linear dot light transmitting bars or linear dot light shielding bars are arranged in the area of the second pad carrier, and the length direction of each linear dot light transmitting bar or each linear dot light shielding bar is perpendicular to the length direction of the etched region, and thus a depression can be formed on the top of the sub photo spacer as implementing exposure and development to the photosensitive resin material to avoid formation of slight protrusions at two sides of the sub photo spacer to improve the flatness of the top of the sub photo spacer.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Figure 1:
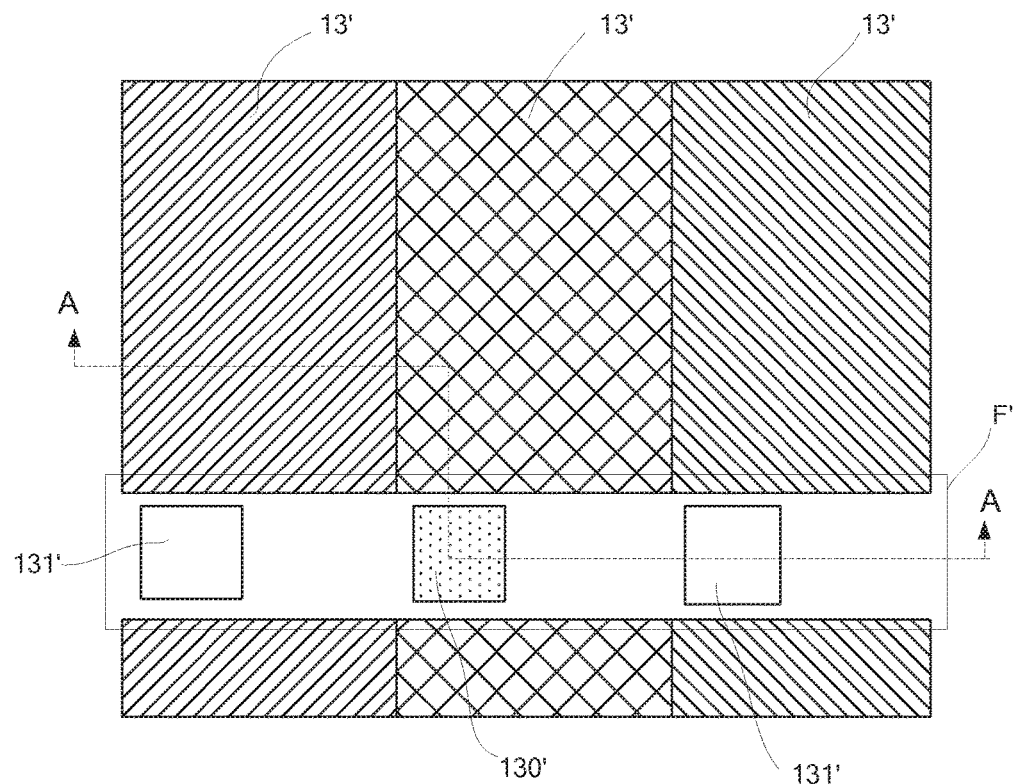
FIG. 1 is a structural view diagram of a color resist region and a photo spacer region of an array substrate in the prior art.
Figure 2:
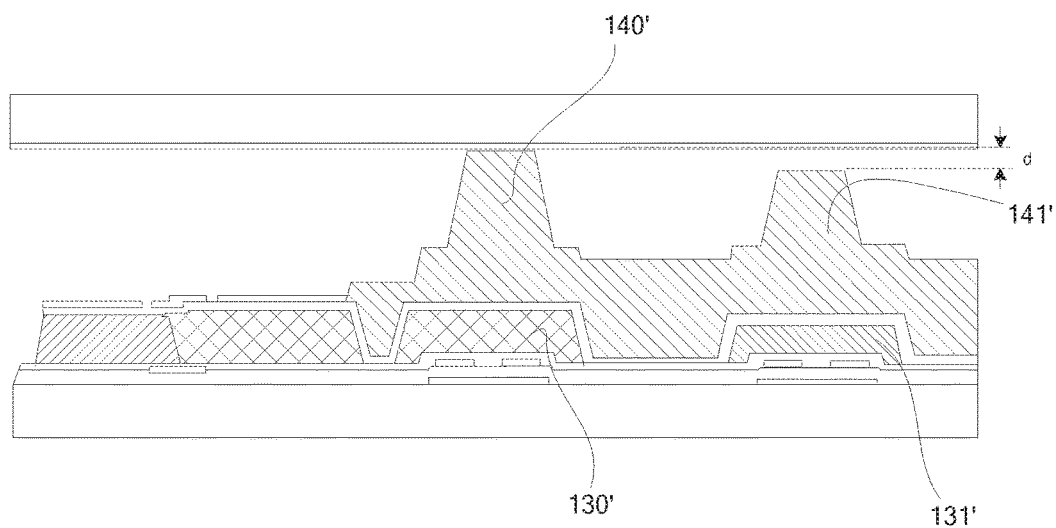
FIG. 2 is an A-A sectional view diagram of a liquid crystal display panel in FIG. 1.

Embodiments of the present invention are described in detail with the technical matters, structural features, achieved objects, and effects with reference to the accompanying drawings as follows. It is clear that the described embodiments are merely part of embodiments of the present invention, but not all embodiments. Based on the embodiments of the present invention, all other embodiments to those of ordinary skill in the premise of no creative efforts obtained, should be considered within the scope of protection of the present invention.

Here, it should also be noted that, in order to avoid obscuring the present invention due to unnecessary details, only the structures and/or processing steps closely related to the solution according to the present invention are shown in the drawings, and other details that are not relevant to the present invention are omitted.

Figure 3:
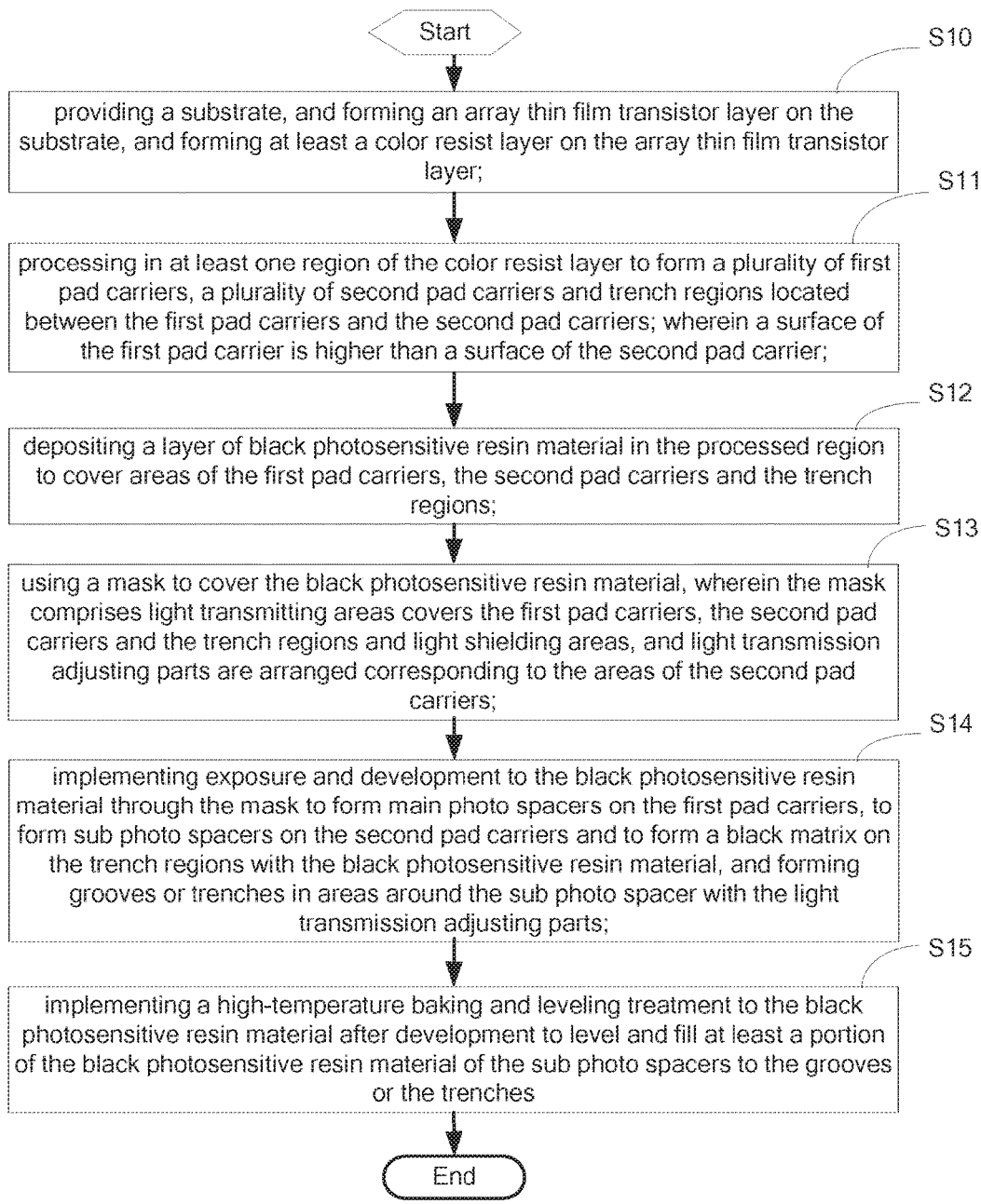
FIG. 3 is a main flowchart of one embodiment of a manufacturing method of an array substrate provided by the present invention.
Figure 4:
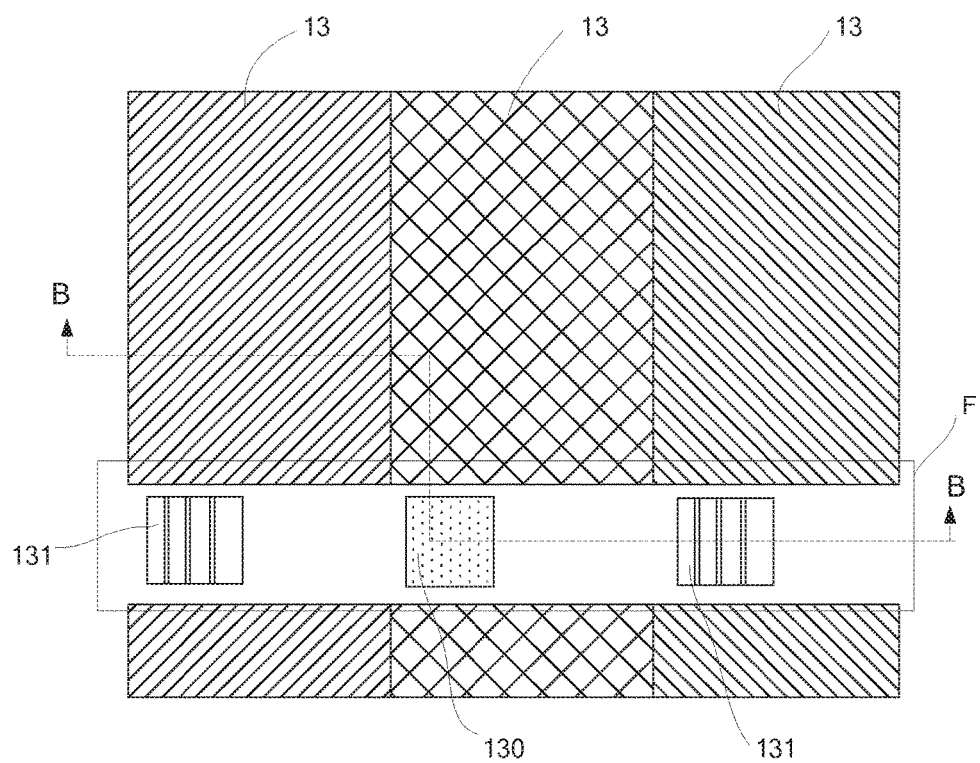
FIG. 4 is a structural view diagram of a color resist region and a photo spacer region of an array substrate in FIG. 3.

As shown in FIG. 3, shows a main flowchart of one embodiment of a manufacturing method of an array substrate provided by the present invention. With conjunction of FIG. 4 to FIG. 7, in this embodiment, the manufacturing method comprises:

Step S10, providing a substrate 10, and forming an array thin film transistor layer 11 on the substrate 10, and forming at least a color resist layer 13 on the array thin film transistor layer 11;

Step 11, processing (such as exposure and development) in at least one region (seeing F region in FIG. 4) of the color resist layer 13 to form a plurality of first pad carriers 130, a plurality of second pad carriers 131 and trench regions 132 located between the first pad carriers 130 and the second pad carriers 131; wherein a surface of the first pad carrier 130 is higher than a surface of the second pad carrier 131, and a main photo spacer will be formed on the first pad carrier 130 and a sub photo spacer will be formed on the second pad carrier 131; more specifically, the processed regions are arranged along gate lines (not shown) of the array thin film transistor layer.

Figure 5:
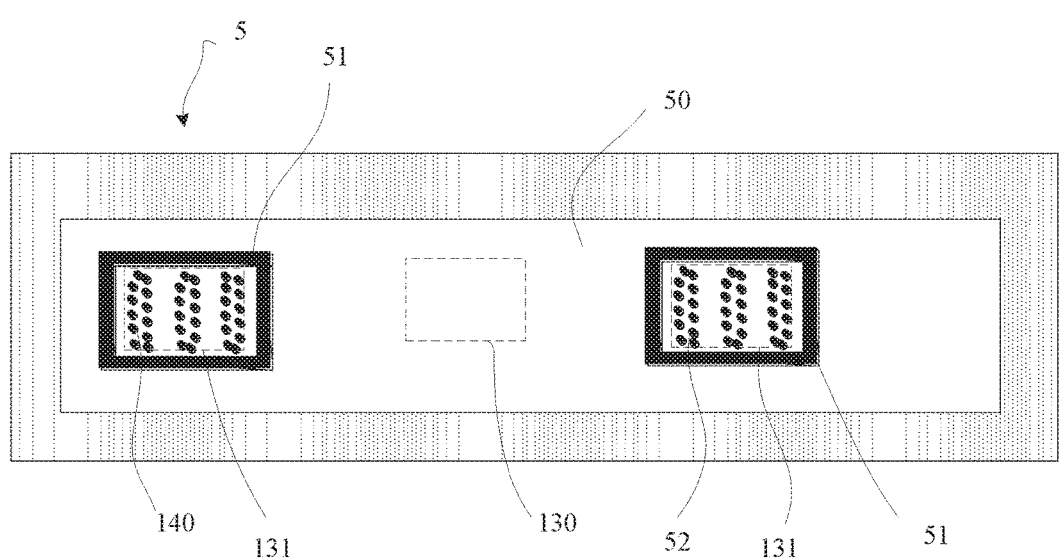
FIG. 5 is a structural view diagram of a mask in FIG. 3.
Figure 6:
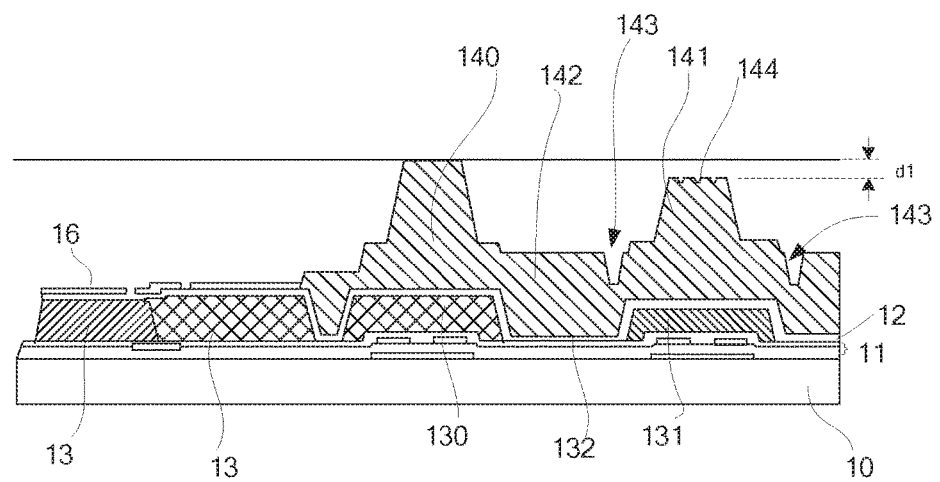
FIG. 6 is a B-B sectional view diagram of an array substrate in FIG. 3 after exposure and development with a mask.

Step S12, depositing a layer of black photosensitive resin material in the processed region F to cover areas of the first pad carriers 130, the second pad carriers 131 and the trench regions 132, wherein it can be understood that in the practical embodiment, the region of depositing the black photosensitive resin material is larger than the etched region in the color resist layer, and the black photosensitive resin material is a negative photosensitive material or a positive photosensitive material;

it can be understood that in the practical embodiment, before depositing the black photosensitive resin material, it is necessary to deposit an insulating layer 12 on the first pad carriers 130, the second pad carriers 131 and the trench regions 132; in this embodiment, the insulating layer 12 can be made of SiOx material or SiOx/SiNx composite material;

Step S13, using a mask 5 to cover the black photosensitive resin material, as shown in FIG. 5, wherein the mask 5 comprises light transmitting areas 50 covers the first pad carriers 130, the second pad carriers 132 and the trench regions, and for convenience, the areas corresponding to the first pad carriers and the second pad carriers in the light transmitting areas 50 are respectively indicated by dashed lines. It can be understood that FIG. 5 only shows one example. As the black photosensitive resin material is a negative photosensitive material, the mask 5 is provided with the light transmitting areas 50 covering the plurality of first pad carriers, the second pad carriers and the trench regions; or as the black photosensitive resin material is a positive photosensitive material, the mask 5 is provided with the light shielding areas covering the plurality of first pad carriers, the second pad carriers and the trench regions; in sum, in the practical application, if a negative material is used, the chromium (Cr) layer is removed in the areas 50 to form light transmission areas; if a positive material is used, the chromium layer is formed in the areas 50 to form light shielding areas; more specifically, the light transmission adjusting parts are arranged in the areas corresponding to the second pad carriers 130, for instance, as the areas 50 are the light transmission areas, the light transmission adjusting parts are light shielding structures; on the contrary, as the areas 50 are the light shielding areas, the light transmission adjusting parts are light transmitting structures;

specifically, in one illustration, as the negative photosensitive material, the light shielding structure arranged in the area of the second pad carrier 130 is an annular light shielding bar 51 arranged around the area of the second pad carrier 130, and a width of the light shielding bar is less than 8 μm (such as 4 μm), and a distance of the light shielding bar 51 from an edge of the sub photo spacer is less than 4 μm (such as 2 μm).

Furthermore, in some embodiments, the light transmitting structure further comprises: a plurality of linear dot light shielding bars 52 arranged in the area of the second pad carrier 131, wherein a length direction of each linear dot light shielding bar 52 is perpendicular to the length direction of the etched region, and each linear dot light shielding bar 52 comprises a plurality of light shielding dots, and a number of linear dot light shielding bars is set according to the actual situation, and a space between adjacent light shielding dots may not be equal;

It can be understood that as the photosensitive material is used, the light transmitting structure arranged in the area of the second pad carrier is an annular light transmitting bar arranged around the area of the second pad carrier, and a width of the light transmitting bar is less than 8 μm, and a distance of the light transmitting bar from the edge of the sub photo spacer is less than 4 μm.

Furthermore, the light transmitting structure further comprises: a plurality of linear dot light transmitting bars arranged in the area of the second pad carrier, and each linear dot light transmitting bar comprises a plurality of light transmitting dots, and a length direction of each linear dot light transmitting bar is perpendicular to the length direction of the etched region.

Figure 7:
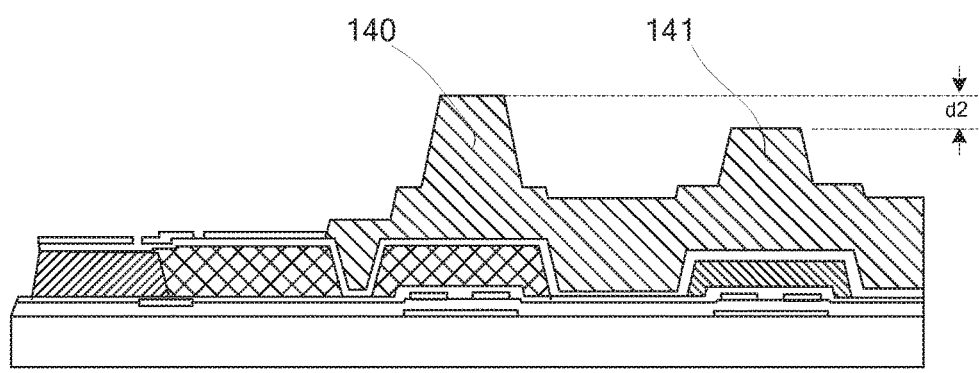
FIG. 7 is a B-B sectional view diagram of an array substrate in FIG. 3 after a baking and leveling treatment.

Step S14, implementing exposure and development to the black photosensitive resin material through the mask 5 to form main photo spacers 140 on the first pad carriers 130, to form sub photo spacers 141 on the second pad carriers 131 and to form a black matrix 142 on the trench regions 132 with the black photosensitive resin material, and forming grooves or trenches 143 in areas around the sub photo spacer 141 with the light transmission adjusting parts, and it can be understood that the grooves or trenches 143 are formed with the annular light shielding bars 51 (or annular light transmitting bar) in the mask 50; moreover, in the embodiment that the mask 5 comprises linear dot light shielding bars 52 (or linear dot light transmitting bars), a depression 144 can be formed on the top of the sub photo spacer 141, and since a length direction of the depression 144 is roughly perpendicular with the direction of the gate lines, formation of slight protrusions at two sides of the sub photo spacer perpendicular to the direction of the gate lines can be avoided;

Step S15, implementing a high-temperature baking and leveling treatment to the black photosensitive resin material after development to level and fill at least a portion of the black photosensitive resin material of the sub photo spacers 141 to the grooves or the trenches 143, and to lower the heights of the sub photo spacers 141. FIG. 7 shows the structure after the high-temperature baking and leveling treatment. As shown in figure, the grooves 143 in FIG. 6 have been leveled, and the tops of the sub photo spacers 141 become flatter and the heights are also reduced, and the height difference d2 between the main photo spacer 140 and the sub photo spacer 141 in FIG. 7 is greater than the height difference d1 between the two in FIG. 6:

It can be understood that in the specific process of manufacturing the array substrate, devices such as pixel electrodes 16 need to be formed on the insulating layer 12.

Correspondingly, the present invention provides a manufacturing method of a photo spacer structure of an array substrate, comprising:

processing (such as exposure and development) in at least one region of a color resist layer of the array substrate to form a plurality of first pad carriers, a plurality of second pad carriers and trench regions located between the first pad carriers and the second pad carriers; wherein a surface of the first pad carrier is higher than a surface of the second pad carrier, and processed regions are arranged along gate lines of the array thin film transistor layer;

depositing an insulating layer on the first pad carriers, the second pad carriers and the trench regions, which are formed by etching;

depositing a layer of black photosensitive resin material on the insulating layer in the processed region to cover areas of the first pad carriers, the second pad carriers and the trench regions, wherein the black photosensitive resin material is a negative photosensitive material or a positive photosensitive material;

using a mask to cover the black photosensitive resin material, wherein the mask comprises light transmitting areas covers the first pad carriers, the second pad carriers and the trench regions and light shielding areas, and light transmission adjusting parts are arranged corresponding to the areas of the second pad carriers;

implementing exposure and development to the black photosensitive resin material through the mask to form main photo spacers on the first pad carriers, to form sub photo spacers on the second pad carriers and to form a black matrix on the trench regions with the black photosensitive resin material, and forming grooves or trenches in areas around the sub photo spacer with the light transmission adjusting parts;

implementing a high-temperature baking and leveling treatment to the black photosensitive resin material after development to level and fill at least a portion of the black photosensitive resin material of the sub photo spacers to the grooves or the trenches.

In can be understood that in some embodiments, as the black photosensitive resin material is a negative photosensitive material, the mask is provided with the light transmitting areas covering the plurality of first pad carriers, the second pad carriers and the trench regions, and the light transmission adjusting parts are light shielding structures, and a width of the light transmitting bar is less than 8 μm, and a distance of the light transmitting bar from the edge of the sub photo spacer is less than 4 μm.

In some other embodiments, the light shielding structure further comprises: a plurality of linear dot light shielding bars arranged in the area of the second pad carrier, wherein a length direction of each linear dot light shielding bar is perpendicular to a length direction of an etched region; by arranging the linear dot light shielding bars, a depression can be formed on the top of the sub photo spacer during exposure and development of the photosensitive resin material.

It can be understood that in other embodiments, as the black photosensitive resin material is a positive photosensitive material, the mask is provided with the light shielding areas covering the plurality of first pad carriers, the second pad carriers and the trench regions, and the light transmission adjusting parts are light transmitting structures. In some embodiments, the light transmitting structure is an annular light transmitting bar arranged around the area of the second pad carrier, and a width of the light transmitting bar is less than 8 μm, and a distance of the light transmitting bar from the edge of the sub photo spacer is less than 4 μm.

For more details, reference may be made to the foregoing descriptions of FIG. 3 to FIG. 7 and details are not described herein.

With implementing the embodiments of the present invention, the benefits are:

According to the manufacturing method provided by the present invention, an annular light transmission adjusting parts is arranged in the region of the mask corresponding to the second pad carrier, thus grooves or trenches can be formed around the sub photo spacer, and then the black photosensitive resin material after development is implemented with the high-temperature baking and leveling treatment, so that at least a portion of the black photosensitive resin material of the sub photo spacer is leveled and filled to the grooves or trenches to reduce the height of the sub photo spacer, thus increasing the height difference between the main photo spacer and the sub photo spacer;

meanwhile, since a plurality of linear dot light transmitting bars or linear dot light shielding bars are arranged in the area of the second pad carrier, and the length direction of each linear dot light transmitting bar or each linear dot light shielding bar is perpendicular to the length direction of the etched region, and thus a depression can be formed on the top of the sub photo spacer as implementing exposure and development to the photosensitive resin material to avoid formation of slight protrusions at two sides of the sub photo spacer to improve the flatness of the top of the sub photo spacer.

Incidentally, herein, relational terms such as first and second and the like are only used to distinguish one entity or operation from another entity or operation separate, without necessarily requiring or implying these entities or operations of between the presence of any such actual relationship or order. Further, the term "comprising", "containing" or any other variation thereof are intended to cover a non-exclusive inclusion, such that a process, method, article, article, or apparatus not include only those elements but not expressly listed further comprising the other elements, or further comprising such process, method, article, or apparatus inherent elements. Without more constraints, by the wording "include a" defined does not exclude the existence of additional identical elements in the element comprising a process, method, article, or apparatus.

Above are only specific embodiments of the present application, the scope of the present application is not limited to this, and to any persons who are skilled in the art, change or replacement which is easily derived should be covered by the protected scope of the application. Thus, the protected scope of the application should go by the subject claims.

What is claimed is:

1. A manufacturing method of a photo spacer structure of an array substrate, comprising:

processing in at least one region of a color resist layer of the array substrate to form a plurality of first pad carriers, a plurality of second pad carriers and trench regions located between the first pad carriers and the second pad carriers; wherein a surface of the first pad carrier is higher than a surface of the second pad carrier;

depositing a layer of black photosensitive resin material in the processed region to cover areas of the first pad carriers, the second pad carriers and the trench regions;

using a mask to cover the black photosensitive resin material, wherein the mask comprises light transmitting areas covers the first pad carriers, the second pad carriers and the trench regions and light shielding areas, and light transmission adjusting parts are arranged corresponding to the areas of the second pad carriers;

implementing exposure and development to the black photosensitive resin material through the mask to form main photo spacers on the first pad carriers, to form sub photo spacers on the second pad carriers and to form a black matrix on the trench regions with the black photosensitive resin material, and forming grooves or trenches in areas around the sub photo spacer with the light transmission adjusting parts;

implementing a high-temperature baking and leveling treatment to the black photosensitive resin material after development to level and fill at least a portion of the black photosensitive resin material of the sub photo spacers to the grooves or the trenches.

2. The manufacturing method according to claim 1, further comprising depositing an insulating layer on the first pad carriers, the second pad carriers and the trench regions.

3. The manufacturing method according to claim 2, wherein as the black photosensitive resin material is a negative photosensitive material, the mask is provided with the light transmitting areas covering the plurality of first pad carriers, the second pad carriers and the trench regions, and the light transmission adjusting parts are light shielding structures; or as the black photosensitive resin material is a positive photosensitive material, the mask is provided with the light shielding areas covering the plurality of first pad carriers, the second pad carriers and the trench regions, and the light transmission adjusting parts are light transmitting structures.

4. The manufacturing method according to claim 3, wherein the light shielding structure arranged in the area of the second pad carrier is an annular light shielding bar arranged around the area of the second pad carrier, and a width of the light shielding bar is less than 8 µm, and a distance of the light shielding bar from an edge of the sub photo spacer is less than 4 µm; or the light transmitting structure arranged in the area of the second pad carrier is an annular light transmitting bar arranged around the area of the second pad carrier, and a width of the light transmitting bar is less than 8 µm, and a distance of the light transmitting bar from the edge of the sub photo spacer is less than 4 µm.

5. The manufacturing method according to claim 4, wherein the light shielding structure further comprises: a plurality of linear dot light shielding bars arranged in the area of the second pad carrier, wherein a length direction of each linear dot light shielding bar is perpendicular to a length direction of an etched region; or the light transmitting structure further comprises: a plurality of linear dot light transmitting bars arranged in the area of the second pad carrier, wherein a length direction of each linear dot light transmitting bar is perpendicular to the length direction of the etched region.

6. The manufacturing method according to claim 5, wherein processed regions are arranged along gate lines of the array thin film transistor layer.

7. A manufacturing method of an array substrate, comprising:

providing a substrate, and forming an array thin film transistor layer on the substrate, and forming at least a color resist layer on the array thin film transistor layer;

processing in at least one region of the color resist layer to form a plurality of first pad carriers, a plurality of second pad carriers and trench regions located between the first pad carriers and the second pad carriers; wherein a surface of the first pad carrier is higher than a surface of the second pad carrier;

depositing a layer of black photosensitive resin material in the processed region to cover areas of the first pad carriers, the second pad carriers and the trench regions;

using a mask to cover the black photosensitive resin material, wherein the mask comprises light transmitting areas covers the first pad carriers, the second pad carriers and the trench regions and light shielding areas, and light transmission adjusting parts are arranged corresponding to the areas of the second pad carriers;

implementing exposure and development to the black photosensitive resin material through the mask to form main photo spacers on the first pad carriers, to form sub photo spacers on the second pad carriers and to form a black matrix on the trench regions with the black photosensitive resin material, and forming grooves or trenches in areas around the sub photo spacer with the light transmission adjusting parts;

implementing a high-temperature baking and leveling treatment to the black photosensitive resin material after development to level and fill at least a portion of the black photosensitive resin material of the sub photo spacers to the grooves or the trenches.

8. The manufacturing method according to claim 7, further comprising depositing an insulating layer on the first pad carriers, the second pad carriers and the trench regions, which are formed by etching.

9. The manufacturing method according to claim 8, wherein as the black photosensitive resin material is a negative photosensitive material, the mask is provided with the light transmitting areas covering the plurality of first pad carriers, the second pad carriers and the trench regions, and the light transmission adjusting parts are light shielding structures; or as the black photosensitive resin material is a positive photosensitive material, the mask is provided with the light shielding areas covering the plurality of first pad carriers, the second pad carriers and the trench regions, and the light transmission adjusting parts are light transmitting structures.

10. The manufacturing method according to claim 9, wherein the light shielding structure arranged in the area of the second pad carrier is an annular light shielding bar arranged around the area of the second pad carrier, and a width of the light shielding bar is less than 8 µm, and a distance of the light shielding bar from an edge of the sub photo spacer is less than 4 µm; or the light transmitting structure arranged in the area of the second pad carrier is an annular light transmitting bar arranged around the area of the second pad carrier, and a width of the light transmitting bar is less than 8 µm, and a distance of the light transmitting bar from the edge of the sub photo spacer is less than 4 µm.

11. The manufacturing method according to claim 10, wherein the light shielding structure further comprises: a plurality of linear dot light shielding bars arranged in the area of the second pad carrier, wherein a length direction of each linear dot light shielding bar is perpendicular to a length direction of an etched region; or the light transmitting structure further comprises: a plurality of linear dot light transmitting bars arranged in the area of the second pad carrier, wherein a length direction of each linear dot light transmitting bar is perpendicular to the length direction of the etched region.

12. The manufacturing method according to claim 11, wherein processed regions are arranged along gate lines of the array thin film transistor layer.

* * * * *